United States Patent
Schrock

Patent Number: 6,016,004
Date of Patent: Jan. 18, 2000

[54] METHOD AND APPARATUS FOR EPOXY LOC DIE ATTACHMENT

[75] Inventor: Ed A. Schrock, Boise, Id.

[73] Assignee: Micron Technology, Inc., Boise, Id.

[21] Appl. No.: 09/035,320

[22] Filed: Mar. 5, 1998

Related U.S. Application Data

[62] Division of application No. 08/907,330, Aug. 6, 1997.

[51] Int. Cl.[7] .................................................. H01L 23/495
[52] U.S. Cl. ........................... 257/676; 257/735; 257/783
[58] Field of Search ..................................... 257/783, 676, 257/666, 787, 667, 735; 438/106

[56] References Cited

U.S. PATENT DOCUMENTS

| | | |
|---|---|---|
| 4,862,245 | 8/1989 | Pashby et al. . |
| 5,256,598 | 10/1993 | Farnworth et al. . |
| 5,286,679 | 2/1994 | Farnworth et al. . |
| 5,304,842 | 4/1994 | Farnworth et al. . |
| 5,548,091 | 8/1996 | DiStefano et al. . |
| 5,548,160 | 8/1996 | Corbett et al. . |
| 5,563,443 | 10/1996 | Beng et al. ............................. 257/676 |
| 5,679,194 | 10/1997 | Fjelstad et al. . |
| 5,770,706 | 6/1998 | Wu et al. . |
| 5,802,699 | 9/1998 | Fjelstad et al. . |
| 5,807,453 | 9/1998 | Smith et al. . |
| 5,861,678 | 1/1999 | Schrock ................................. 257/783 |

*Primary Examiner*—Carl Whitehead, Jr.
*Assistant Examiner*—Roy Potter
*Attorney, Agent, or Firm*—Trask, Britt & Rossa

[57] ABSTRACT

A plurality of lead frames is supplied in frame by frame sequence. A curable adhesive, preferably a 505 Epoxy, is applied to one surface of each lead frame as it indexes through an application device. An attaching device attaches a device and holds it during in place to cure for a preselected period of time of about one second to each device site with adhesive. Later, the lead frames have their edges trimmed and then are separated into separate lead frames.

14 Claims, 5 Drawing Sheets

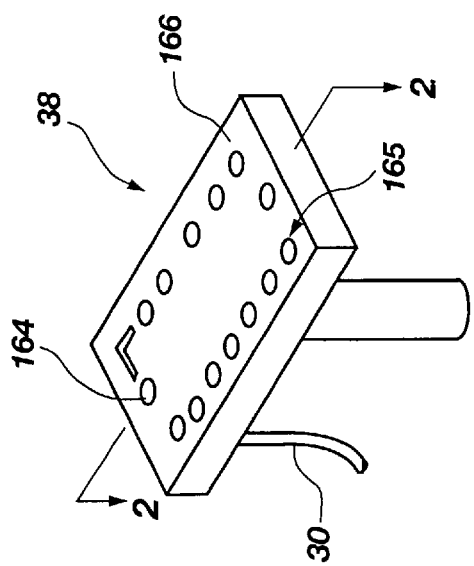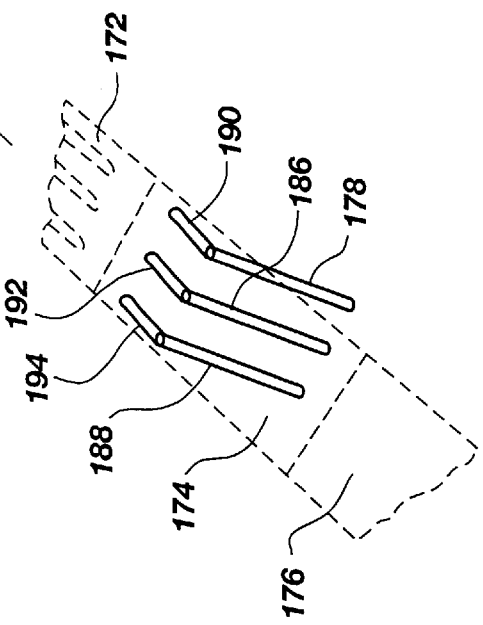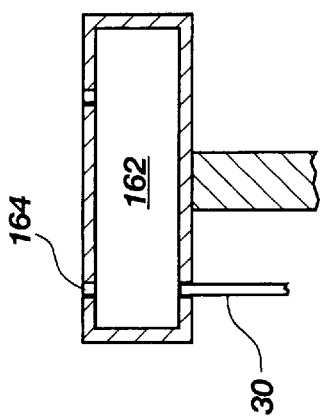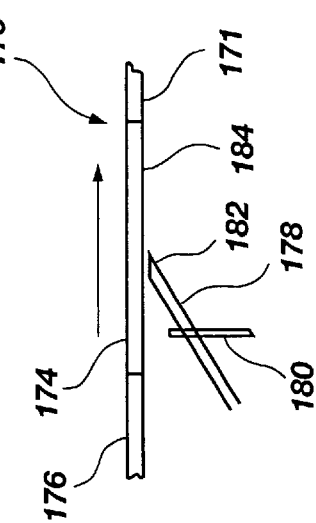

METHOD AND APPARATUS FOR EPOXY LOC DIE ATTACHMENT

This application is a divisional of Ser. No. 08/907,330 filed Aug. 6, 1995.

BACKGROUND OF THE INVENTION

1. Field of the Invention

The present invention relates to semiconductor device manufacture and, more particularly, to methods and structures for attaching semiconductor devices to lead frames.

2. State of the Art

During the manufacture of semiconductor devices, a semiconductor device or chip is often attached to a support, such as a lead frame. In general, a "leads-over-die" or "lead-on-chip" semiconductor device assembly has a lead frame with lead fingers that extend over the active surface of the semiconductor device supporting the semiconductor device being electrically connected to the bond pads located thereon, typically by wire bonds extending between the bond pads and the ends of the lead fingers, the other ends of the lead fingers for attachment to other circuit components. The lead fingers extend inwardly on the lead frame to bond pads located on the active surface of the semiconductor device for connection thereto as described in U.S. Pat. No. 4,862,245 (Pashby, et al.) and U.S. Pat. No. 5,304,842 (Farnworth, et al.).

The semiconductor device may be attached to the lead frame using adhesively coated tape as described in U.S. Pat. No. 5,304,842 (Farnworth et al.) or by the use of hot or cold adhesives as described in U.S. Pat. No. 5,286,679 (Farnworth et al.). Use of hot or cold thermosetting or thermoplastic adhesives that have heretofore been suggested affect the processing of the semiconductor device assemblies as they require cure time for the adhesive and, in turn, cause delays in the manufacturing process to effect curing.

Therefore, it is desirable to have an adhesive for attaching the semiconductor device to a lead frame which has the shortest desirable cure time for the adhesive to allow the manufacturing process to proceed.

BRIEF SUMMARY OF THE INVENTION

A system for attaching a semiconductor device or die to each lead frame of a plurality of lead frames includes indexing means for supplying and advancing the plurality of lead frames for semiconductor devices in a lead frame-by-lead frame sequence. Each lead frame of the plurality of lead frames has an attaching surface to which a semiconductor device or die is to be attached. The system also includes a source of curable adhesive. Application means are configured for receiving the plurality of lead frames for semiconductor devices in the lead frame-by-lead frame sequence. The application means is connected to the source of curable adhesive for receiving curable adhesive therefrom. The application means is also configured for applying a metered amount of the curable adhesive in a preselected pattern to the application surface of each lead frame of the plurality of lead frames. The application means then supplies the lead frames with the curable adhesive applied thereto.

The system also includes a source of semiconductor devices to supply semiconductor devices in a semiconductor device-by-semiconductor device sequence. Attaching means are positioned relative to the source of semiconductor devices to obtain each semiconductor device of the plurality of semiconductor devices in the semiconductor device-by-semiconductor device sequence. The attaching means is also positioned to receive the lead frames with the curable adhesive applied thereto in lead frame-by-lead frame sequence from the application means. The attaching means is also configured to attach one of the said devices to a corresponding lead frame of the plurality of lead frames in lead frame-by-lead frame sequence by urging the die into contact with the curable adhesive of each lead frame of the plurality of lead frames and holding each of the semiconductor devices in contact with the curable adhesive for a preselected period. That is, at least one semiconductor device is attached to each lead frame. Of course, in some applications, multiple devices may be attached to a particular lead frame configured to receive multiple semiconductor devices. Control means are provided in the system to supply operation signals to operate the various components thereof.

The attaching means preferably includes press means for pressing each semiconductor device of the plurality of semiconductor devices into contact with a curable adhesive. The attaching means also preferably includes transfer means for transferring each semiconductor device of the plurality of semiconductor devices in semiconductor device-by-semiconductor device sequence from the source of semiconductor devices to the press means.

The press means desirably includes heating means to heat the semiconductor device before it is pressed against the curable adhesive. The heating means is desirably a block positioned to receive each semiconductor device of a plurality of semiconductor devices from the transfer means. The press means most preferably includes a press mechanism to move the block from a receiving position to receive thereon a semiconductor device of the plurality of semiconductor devices into an attached position in which the block with a semiconductor device of the plurality of semiconductor devices is urged into contact with the curable adhesive. The heating means desirably heats the block to a temperature from about 200° C. to about 225° C.

The curable adhesive is most preferably a snap curable epoxy having a cure time of substantially less than one minute and most preferably having a cure time of less than one second. In a preferable configuration, it is desirable that the curable adhesive have a filler material included therein. The filler material may be any electrochemically neutral material but is preferably a granulated Teflon®.

The application means is configured to apply about one milligram of the curable adhesive to each lead frame. The application means may also include a structure positioned to contact the application surface of a lead frame for applying the curable adhesive thereto. The application means may include a roller having portions positioned to selectively contact the surface of the lead frame and the second surface. Alternately, the application means may include a printing structure to contact the application surface of the lead frame or the active surface of the semiconductor device. The printing structure may include a plate, a silkscreen die, or the like. The application means may also optionally include one or more nozzles positioned to deposit the curable adhesive in a desired location on either the lead frame or the active surface of a semiconductor device.

In alternate configurations, the lead frames of the plurality of lead frames are connected one to another. The lead frames preferably have at least one and preferable two removable edges, rails, with drive perforations formed therein. Indexing means includes an electrical device connected to drive structure which is configured to engage the perforations formed in each lead frame.

The attaching means preferably includes an anvil sized for positioning opposite the block and spaced therefrom to receive each lead frame of the plurality of lead frames therebetween. The anvil functions to support each lead frame as the semiconductor device is pressed against the application surface. An anvil may also be positioned opposite the application means to support each lead frame as the curable adhesive is applied thereto.

A method for applying curable adhesive to each lead frame of a plurality of lead frames and a semiconductor device to each such lead frame includes providing a system and operating the system to supply semiconductor devices and lead frames relative to application means and attaching means. The system is also operated to apply adhesive to a semiconductor device site of each lead frame and to then attach a semiconductor device to the adhesive at the semiconductor device site. Preferably, the adhesive is a snap curable epoxy with a cure time of about 1 second. Even more preferably, the application means includes a pressing structure which includes a block that heats the semiconductor devices to a temperature from about 200 degrees centigrade to about 225 degrees centigrade.

BRIEF DESCRIPTION OF THE SEVERAL VIEWS OF THE DRAWINGS

In the drawings which illustrate what is presently regarded as preferred modes of carrying out the invention:

FIG. 2 is a printing structure of the system of the invention of FIG. 1 for printing adhesives onto a lead frame;

FIG. 3 is a cross section of FIG. 2 taken at the section 2—2;

FIG. 4 shows an adhesive application nozzle for use in a system of the invention positioned relative to lead frames;

FIG. 5 is a perspective view of multiple adhesive application nozzles for use in a system of the invention positioned relative to lead frames;

DETAILED DESCRIPTION OF THE INVENTION

Figure 1:
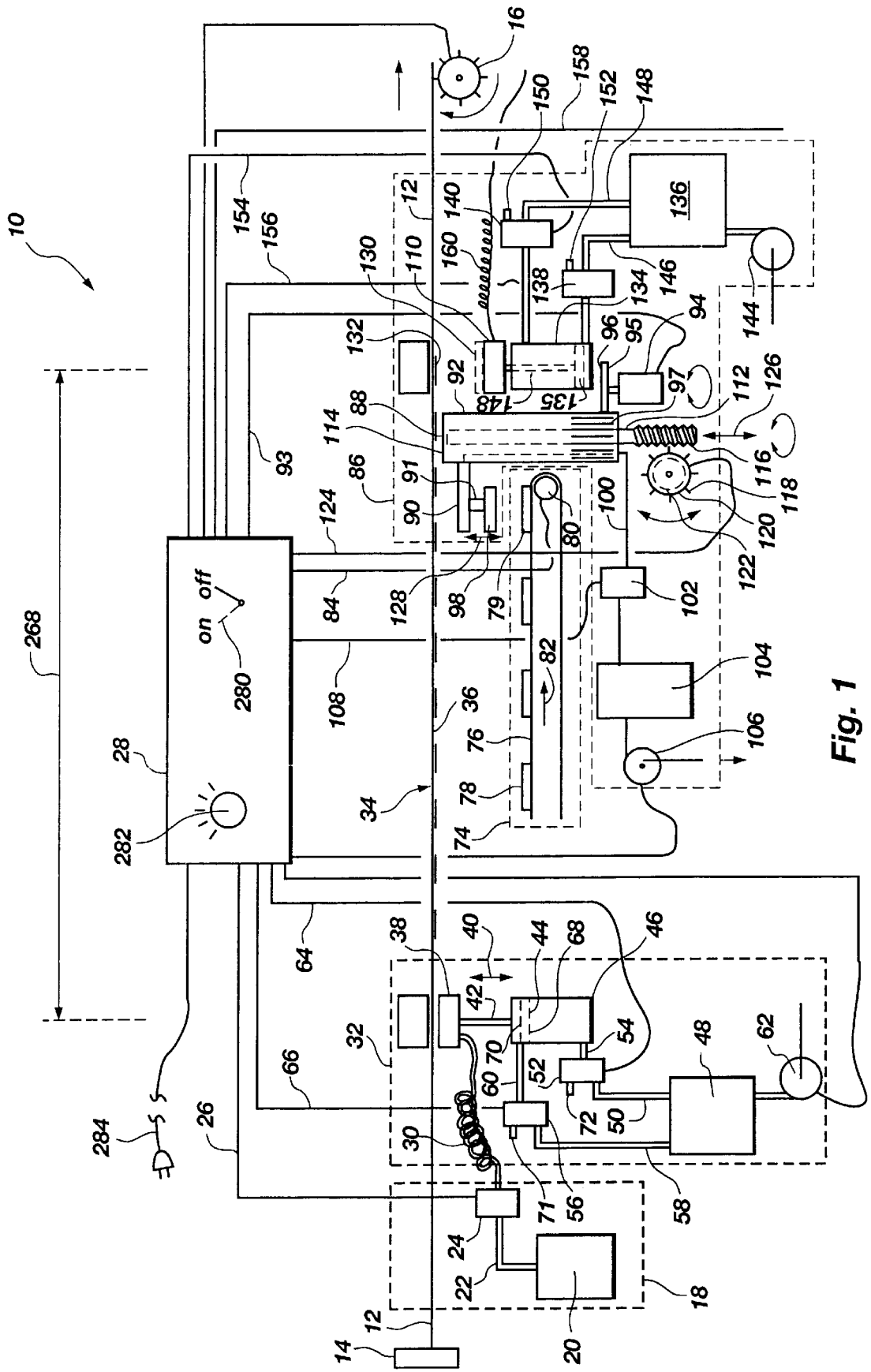
FIG. 1 is a simplified diagram of a system of the invention.

Referring to drawing FIG. 1, a system 10 is illustrated for attaching a semiconductor device to each lead frame of a plurality of lead frames to form a corresponding plurality of semiconductor device assemblies suitable for use in various electronic circuits.

The system 10 includes indexing means for supplying and advancing a plurality of lead frames for semiconductor devices in a lead frame-by-lead frame sequence. More specifically, the lead frames 12 are supplied from a source 14 and are urged or moved relative to the other structures of the system by a driver 16 which is constructed to drivingly engage and move the plurality of lead frames in lead frame-by-lead frame sequence, all as more fully discussed hereinafter.

The system 10 also includes a source 18 of curable adhesive. The source 18 of curable adhesive includes a reservoir 20 interconnected by conduit 22 to an electrically driven solenoid 24. The solenoid 24 is connected by conductor 26 to control means such as controller 28 to receive operation signals therefrom to cause the solenoid 24 to move between a closed position and an opened position. The solenoid 24 may be any suitable solenoid which remains open for a selected period of time so that, given the pressure of the adhesive in the conduit 22, a metered amount is thereby dispensed. Alternately, some other metering device may be used that dispenses the curable adhesive in metered quantities. For example, a gear pump or piston pump may be used to dispense metered amounts of curable adhesive. The adhesive from the source 18 proceeds through the delivery conduit 30 when the solenoid 24 is in the open position. That is, adhesive from the reservoir 20 is urged by any appropriate pressure generating arrangement, including an adhesive pump, air pressure and the like, through the conduit 22 and through a delivery conduit 30 of an application means 32.

Figure 10:
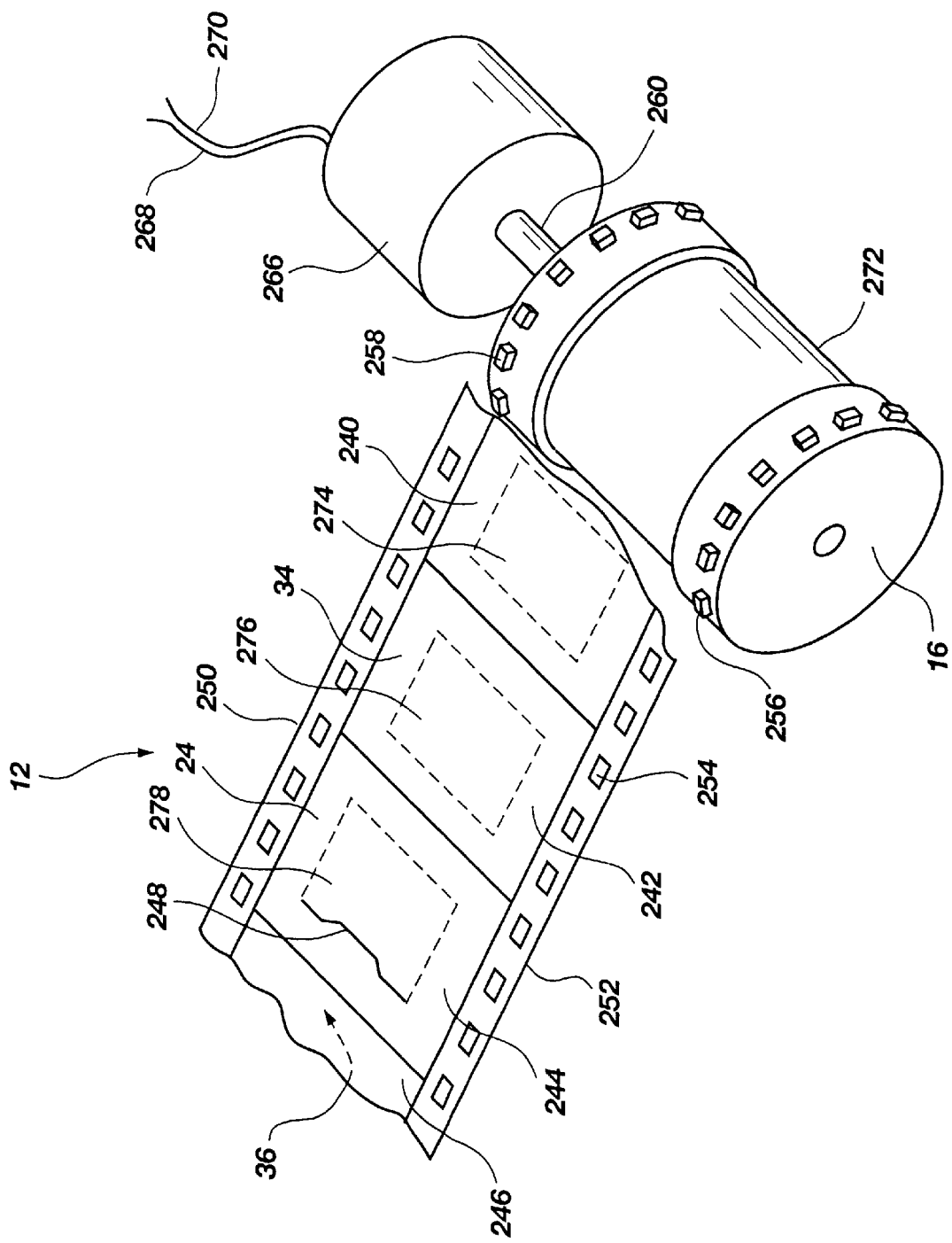
FIG. 10 is a perspective view of an indexing system for use with a system of the invention with a plurality of lead frames depicted partially cut-away and in perspective.

The application means 32 is configured to receive the plurality of lead frames 12 in lead frame-by-lead frame sequence. The application means 32 is connected to the source of curable adhesive 18 to receive curable adhesive therefrom through the delivery conduit 30. The application means 32 is configured and operable to apply the metered amount of curable adhesive in a preselected pattern to one of the application surface 36 opposite a second surface 34 of each lead frame of the plurality of lead frames 12 (FIG. 10). As depicted in FIG. 1, the application means 32 includes an applicator 38 which is here operated in an up and down or in and out direction 40 by a rod 42 connected to a piston 44 positioned in a cylinder 46. The piston 44 is here shown to be fluid driven and may be operated by gas or liquid. However, a gas is preferable because of faster response times, and air is preferable because of low cost.

As illustrated in drawing FIG. 1, air under pressure is received from a reservoir 48 via a first supply line 50 through a first air solenoid 52 and a connector 54 to the cylinder 46. A second air solenoid 56 is connected to receive air under pressure via a second supply line 58. The second air solenoid 56 is connected by a connector 60 to the cylinder 46. In operation, air under pressure is supplied to the reservoir 48, for example, by an on-demand air pump 62. That is, the air pump 62 may operate under the control of the controller 28 or upon detection of a pressure signal indicating a need to increase the pressure in the reservoir. To operate the applicator 38, the air solenoids 52 and 56 are operated by operation signals received from the controller 28 via conductors 64 and 66 so that air under pressure is supplied to the underside 68 of the piston 44 in order to urge the applicator 38 upward 40 toward one of the plurality of lead frames 12. As air under pressure is being supplied to the underside 68 of the piston 44, the air solenoid 56 is positioned to vent air from the top 70 of piston 44 to the atmosphere from the vent 71. When it is desired to have the applicator 38 move away from the plurality of lead frames 12, the air solenoid 52 is positioned to a venting position in order to vent air through vent 72. At the same time, air under pressure may be directed through the air solenoid 56 via the second supply line 58 and the connector 60 to the top 70 of the piston 44 in order to urge it in a downward direction. As so configured, it can be seen that the piston 44 and in turn the applicator 38 may be positioned precisely as desired based on the operation signals received from the controller 28 in order to effect a transfer of adhesive supplied via the delivery conduit 30 to the applicator 38 upon coordinated operation of the solenoid 24.

It may be noted that a first air solenoid 52 and a second air solenoid 56 are here depicted. However, it can be seen that a three-way solenoid valve may be used in lieu of the first air solenoid and the second air solenoid. Further, other mechanisms may be used to meter air or some other suitable fluid to and from the cylinder 46 to regulate the movement of the piston 44.

The system 10 illustrated in drawing FIG. 1 also includes a source of semiconductor devices 74 which is here illustrated only in part as a simple conveyor 76 with a plurality of semiconductor devices 78 positioned thereon. A stepper motor 80 may be operated to cause the conveyor 76 to move the semiconductor devices 78 in a direction 82 toward the attaching means 86. The stepper motor 80 is connected by a conductor 84 to receive operation signals from the controller 28 to in turn cause each device of the plurality of semiconductor devices 78 on the conveyor 76 to index toward the attaching means 86 in coordination or in synchronization with movement of the plurality of lead frames 12.

The attaching means 86 is positioned relative to the source of semiconductor devices 74 to obtain each semiconductor device of the plurality of semiconductor devices 78 in the semiconductor device-by-semiconductor device sequence. The attaching means 86 also is positioned relative to the plurality of lead frames 12 to obtain each lead frame in lead frame-by-lead frame sequence. The attaching means 86 is also configured to attach one semiconductor device of the plurality of semiconductor devices 78 to a corresponding one lead frame of the plurality of lead frames 12 in a lead frame-by-lead frame sequence by urging each semiconductor device 78 into contact with the curable adhesive positioned on the one corresponding lead frame of the plurality of lead frames 12. The attaching means 86 further is operable to hold each semiconductor device of the plurality of semiconductor devices 78 in contact with the curable adhesive for a preselected period of time.

The attaching means 86 illustrated in drawing FIG. 1 is a simplified depiction of a mechanical system that can be assembled to be operated by a control means such as the controller 28 in order to effect desired operations. The attaching means 86 illustrated includes transfer means 88 which is here depicted to be a mechanism with an arm 90 attached to housing 92, both of which are rotatable by driving a gear 96 that interconnects with an appropriate plurality of matching gear elements 97 associated with the housing 92. More specifically, the gear 96 has teeth 95; and the gear elements 97 are recesses to drivingly receive the teeth 95. In operation, the gear teeth 95 and the recesses 97 are configured to cause the housing 92 to rotate about rod 112 upon activation of the stepper motor 94. The stepper motor 94 is connected to the controller 28 by conductor 93 to receive operation signals from the controller 28 to cause the stepper motor 94 to rotate between a pick up position in which the arm 90 is operated to pick up a device of the plurality of semiconductor devices 78 and a release position in which the semiconductor device that has been picked up is deposited on the block 110. Of course, the relationship between the housing 92 and gear 96 may be any desired mechanical or electromechanical arrangement to effect operation of the housing 92 and in turn cause the arm 90 to rotate.

The arm 90 has a pickup 98 which is connected through a conduit 100 and through a solenoid 102 to a reservoir 104 and a vacuum pump 106. The vacuum pump 106 is operated to create a desired vacuum in the reservoir 104. Upon operation of the solenoid 102 by receipt of operation signals from controller 28 via conductor 108, a vacuum is applied through the conduit 100 to the pickup 98. The conduit 100 extends inside the housing 92, the arm 90 and extension 91 to create a vacuum to pick up each device of the plurality of semiconductor devices 78 on the conveyor 76. The pickup 98, as more fully described hereinafter, is positioned proximate each semiconductor device of the plurality of semiconductor devices 78 and picks it up by vacuum in order to reposition the semiconductor device 78 on a block 110.

The transfer means 88 also includes a vertical positioning structure which includes a rod 112 rotatably attached to the housing 92 at the upper end 114. The rod 112 has appropriate teeth 116 configured to interact with drive teeth 118 associated with a gear 120. The gear 120 is driven by a stepping motor 122 shown in phantom. The stepping motor 122 is driven electrically by operation signals received via conductor 124 from the controller 28.

In operation, the transfer means 88 can be moved upwardly and downwardly or inwardly and outwardly 126 by operation of the stepping motor 122. In turn, the arm 90 and the pickup 98 can be moved into close proximity or contact with each semiconductor device of the plurality of semiconductor devices 78. When in virtual contact, appropriate vacuum can be applied by operation of the solenoid 102 so that the semiconductor devices 79 under the pickup 98 may be picked up and raised upon operation of the stepping motor 122. When raised upwardly 126 an appropriate distance 128, the housing 92 may be rotated by operation of the stepper motor 94 through gear 96 and recesses 97. Thus each semiconductor device of the plurality of semiconductor devices 78 may be transferred from the source of semiconductor devices 74 to the block 110.

It may be recognized that the transfer means 88 herein described is simply illustrative of structure to effect the transfer of each semiconductor device of the plurality of semiconductor devices 78 to the block 110. A variety of chutes, slides and similar mechanisms may be devised to effect the positioning of each semiconductor device of the plurality semiconductor device 78 in a sequential fashion onto block 110.

The attaching means 86 also includes a press mechanism to move each semiconductor device of the plurality of semiconductor devices 78 into contact with the curable adhesive. The illustrated mechanism has a block 110 shown in its receiving position in which it receives a semiconductor device of the plurality of semiconductor devices 78. The press mechanism is operable from the receiving position illustrated in drawing FIG. 1 to an attaching position in which block 110 is positioned upwardly toward the plurality of lead frames 12 to contact the curable adhesive 132 associated with the lead frame that has been indexed to be positioned relative to the attaching means 86 and more particularly the press mechanism. That is, a semiconductor device, such as semiconductor device of the plurality of semiconductor devices 78 and more specifically the semiconductor device 130 shown in phantom on the block 110 is urged upwardly to be in contact with the curable adhesive 132 that has been positioned on each lead frame of the plurality of lead frames 12 by the application means 32.

The press mechanism illustrated in drawing FIG. 1 is a hydraulically operated cylinder 134. The hydraulic fluid in the illustrated arrangement of drawing FIG. 1 may be air supplied from a reservoir 136 through a raised solenoid 138 and a lower solenoid 140. That is, air pressure may be created in the reservoir 136 by operation of an air pump 144. The air pressure may be supplied via supply lines 146 and 148 to their respective solenoids 138 and 140. The solenoids 138 and 140 may be operated in sequence to place air pressure underneath the piston 135. Air under pressure under the piston 146 urges the piston 146 upwardly or inwardly while solenoid 140 is operated to vent the air above the piston 135 through a vent line 150 to the atmosphere. Similarly, when the block 110 is to be lowered, the solenoid 140 is operated to provide air pressure to the top part of the piston 135 to urge it downward while the raised solenoid 138 is operated to vent the air thereunder through vent line 152. The solenoids 140 and 138 are connected by conductors 154 and 156, respectively, to the controller 28 to receive operation signals therefrom in order to effect movement of the piston 135 and in turn the block 110. Of course, the air pressure is maintained by appropriate operation of the air pump 144 by receipt of operation signals via conductor 158 from the controller 28 or from a pressure sensor as desired. The solenoids 140 and 138 may be replaced with a three-way solenoid or by other mechanisms to port air or other hydraulic fluid.

Figure 9:
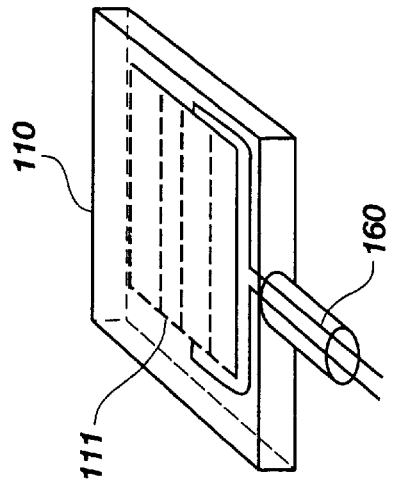
FIG. 9 is a simplified perspective view of a block of the application means of a system of the invention.

The block 110 is here shown with a spring wound electrical conductor 160 extending away therefrom. The conductor 160 is spring wound so that the block 110 may easily move upward and downward as described. The spring wound conductor 160 is connected to a source of electrical power and to a heater 111 (FIG. 9) positioned in the block 110 so that the block may be heated to a desired temperature. In turn a semiconductor device such as semiconductor device 130 is heated in the process of moving it and holding it in place against the adhesive 132 to a desired temperature in order to effect the curing of the adhesive 132 as the semiconductor device 130 comes into contact therewith.

An applicator 38 of the application means 32 is illustrated in more detail in drawing FIGS. 2 and 3. It receives adhesive from the delivery conduit 30 under pressure from the reservoir 20. That is, the adhesive is urged into a distribution chamber 162 so that it may be urged out through a plurality of apertures such as aperture 164. The top 166 of the applicator 38 has a plurality of apertures such as aperture 164 formed therein in a desired pattern. For example, the applicator 38 has an illustrated pattern of apertures 165 which is desired in order to receive and hold a particular device in contact with the bumps or connector pads of a lead frame containing electrical leads in a desired pattern. The apertures 165 may be of different sizes and dimensions as well as in different geographic configuration, all to effect the desired application of adhesive.

In operation, the applicator 38 will be brought into very close proximity to the application surface 34 of a particular lead frame of the plurality of lead frames 12 being indexed by driver 16. Adhesive is urged through the delivery conduit 30 to the distribution chamber 162. Adhesive is thereupon urged outward through the apertures 165 to contact and adhere to the application surface 34 of each lead frame of the plurality of lead frames 12. As each lead frame of the plurality of lead frames is indexed past the applicator 38, the applicator 38 is first retracted and then positioned upward to cause the adhesive to contact the surface of the lead frame and position the adhesive thereon in the desired pattern.

In drawing FIG. 1, there is illustrated a substantial distance between the application means and the attaching means. That is, time to cure could be provided by providing an appropriate or desired distance 168 between the application means 32 and the attaching means 86. The delay in turn can provide time for the adhesive to begin to set up or start its curing process.

Referring to drawing FIGS. 4 and 5, an alternate arrangement of a plurality of lead frames is illustrated in which a plurality of nozzles including nozzles 178, 186 and 188 are shown positioned to apply adhesive to the application surface 171 of lead frames 172, 174 and 176. Thus, it can be seen that the nozzles 178, 186, 188 may provide a desired pattern of adhesive 190, 192 and 194 as illustrated in drawing FIG. 5. Each nozzle 178, 186 and 188 is connected to the common delivery conduit 30 for further connection through the solenoid 24 to the reservoir 20 of curable adhesive.

Referring back to drawing FIG. 2, it can been seen that the applicator 38 is in effect a type of printing mechanism, a portion of which applies adhesive to the underside or to one surface of each lead frame of a plurality of lead frames. In lieu of patterned apertures such as that illustrate in drawing FIGS. 2 and 3, a silk screen structure may be provided over the distribution chamber 162 so that the adhesive may pass there-through in a desired pattern provided in the silkscreen surface.

Figure 7:
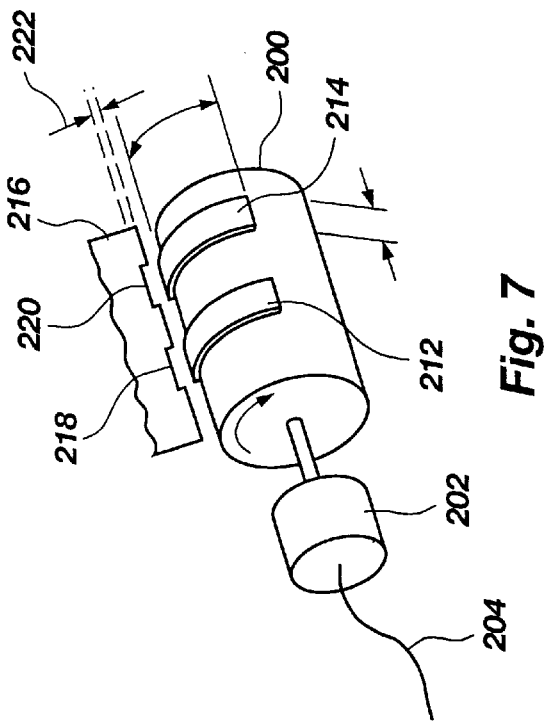
FIG. 7 is a partial perspective view of a roller system comparable to that shown in FIG. 6 for applying adhesive to lead frames.
Figure 6:
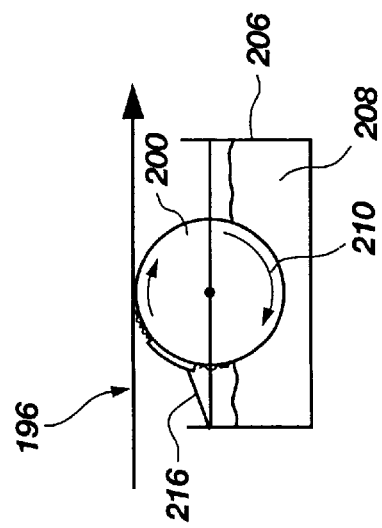
FIG. 6 shows a roller printing mechanism for use in a system of the invention for applying adhesive to lead frames.

In drawing FIGS. 6 and 7, a roller mechanism is illustrated. More specifically, a plurality of lead frames 196 is shown passing relative to a roller 200. The roller 200 driven by a stepping motor, split phase motor or the like, 202 which is connected by a conductor 204 to the controller 28 to receive operation signals therefrom. The roller 200 is positioned in a container 206 which has there within a quantity of curable adhesive 208. As the roller rotates 210 through the adhesive 208, it picks up adhesive on desired adhesive application surfaces. More specifically, as can be better seen in drawing FIG. 7, raised surfaces 212 and 214 are provided. A wiper 216 is positioned in close proximity to the roller 200 in order to wipe all excessive adhesive therefrom and return it to the container 206. As seen in drawing FIG. 7, the wiper 216 has a first notch 218 and a second notch 220 to register with the raised surfaces 212 and 214. The notches 218 and 220 are inset a distance 222 so that the appropriate metered amount of adhesive will remain on the surfaces 212 and 214. In turn, as the roller 200 rotates into contact with a lead frame of a plurality of lead frames 196, adhesive on the surfaces 212 and 214 is deposited on each lead frame of the plurality of lead frames in a desired pattern. That is, the adhesive is applied at a desired site on the desired surface of each lead frame. A plurality of spaced apart surfaces such as surfaces 212 and 214 may be positioned around the perimeter with the roller 200 based on the dimensions of the lead frame and the diameter of the roller 200.

It may be understood that a variety of other systems and structures may be provided in order to apply the adhesive to the underside or to one surface of each lead frame of a plurality of lead frames. In addition to methods or systems herein illustrated or described, one may be able to spray or shoot adhesive in order to effect a desired contact in a preferred pattern.

Figure 8:
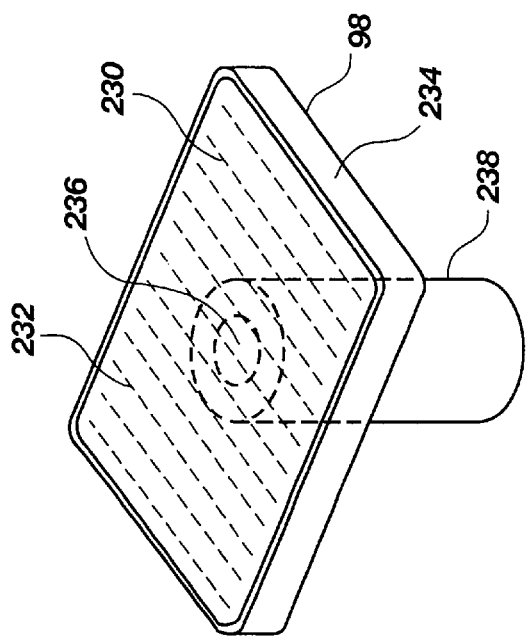
FIG. 8 is a perspective view of a pick-up head of the transfer mechanism for transferring devices of the system of FIG. 1.

As hereinbefore discussed, each semiconductor device of the plurality of semiconductor devices 78 is to be transferred from the source of devices 74 to the block 110. The pickup 98 in drawing FIG. 1 is better illustrated in drawing FIG. 8. The pickup surface 230 is here shown to be a flexible surface with a plurality of small holes 232. The surface 230 may be better described as a porous surface through which air may readily be drawn. Thus the creation of a vacuum in the chamber 234 is transmitted to external the surface 230 wherein suction upon contact with a semiconductor device of the plurality of semiconductor devices 78 is sufficient to hold the semiconductor device against the surface 230. Such semiconductor device may then be retained against the surface 230 and lifted and transferred from the conveyor 76 to the block 110. As can be seen, the vacuum is effected through an internal channel 236 formed in the extension 238 which is connected to the pickup 98.

Turning now to drawing FIG. 10, it can be seen that a plurality of lead frames 12 illustrated in drawing FIG. 1 are here shown consisting of lead frames 240, 242, 244 and 246. Each of the lead frames 240, 242, 244 and 246 has a plurality of lead fingers such as lead finger 248. Each lead frame 240, 242, 244 and 246 is secured with the others by at least one and preferably two outside edges, rails, 250 and 252 formed with perforations 254 to mesh with drive teeth 256 and 258 associated with driver 16. The driver 16 is driven via axle 260 by a driver motor 266 which is connected by conductors 268 and 270 to the controller 28 in order to cause the plurality of lead frames 12 to index or to move relative to the application means 32 and the attaching means 86 as desired. As here shown, the driver 16 has an internal recessed portion 272 which allows the lead frames with a respective device or devices or semiconductor chips 274, 276 and 278 attached thereto to pass there over for further processing in which the lead frames are separated one from the other and wherein the outside edges 252 and 250 are separated therefrom.

Figure 11:
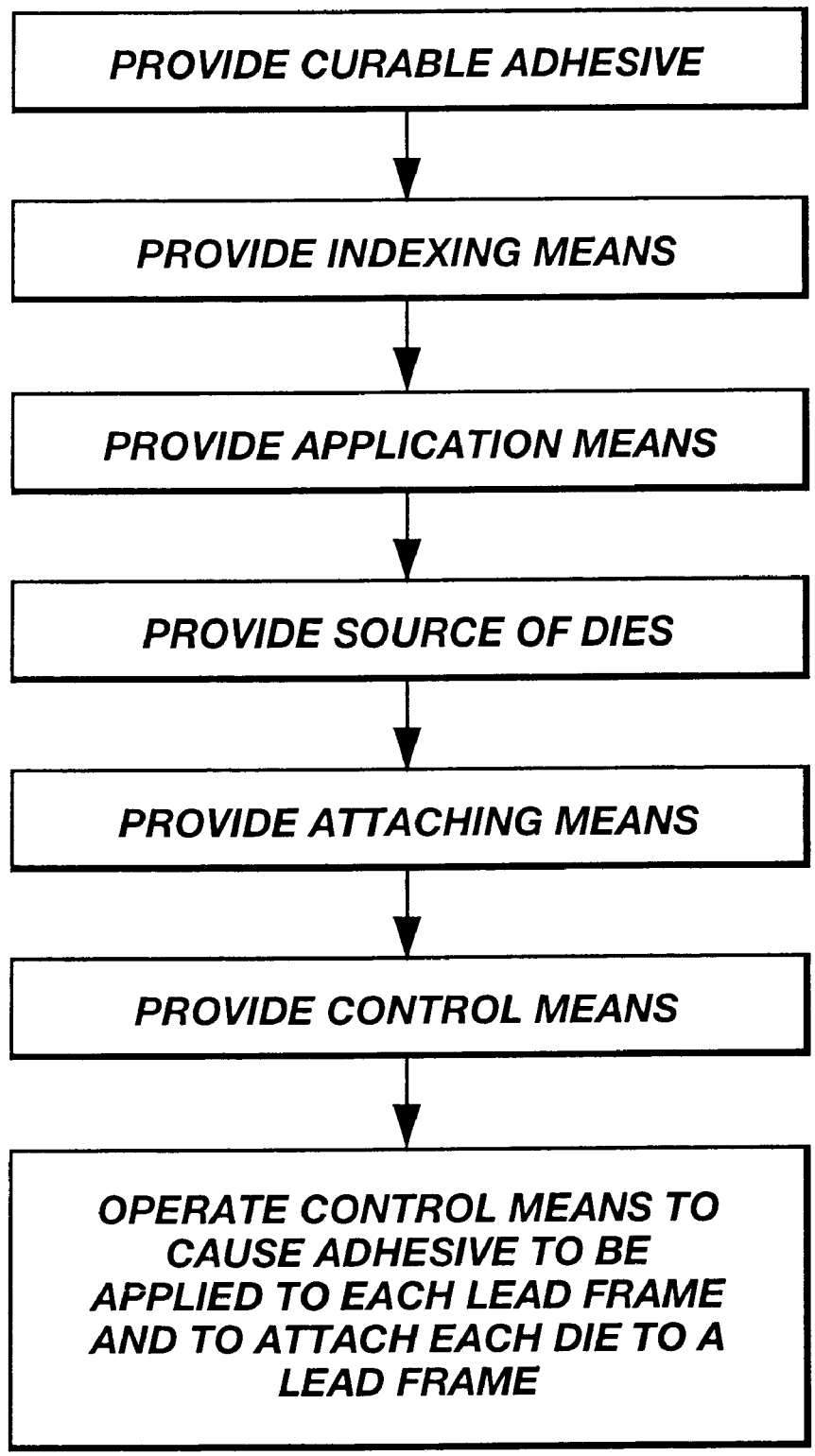
FIG. 11 is a block diagram of a method of the invention.

It can be seen herein and as illustrated in drawing FIG. 11 that to operate the illustrated system, the user needs to provide a system such as that illustrated in drawing FIG. 1. In operation, the controller 28 is activated by positioning an on/off switch such as on/off switch 280 to an on position. Appropriate speed or rate information is selected by operation of the dial 282 relative to an index. Other mechanisms may be used to input the speed or rate of operation that is desired. A variety of computers or similar electronic devices may be used to generate the necessary operation signals to operate the various devices herein through various electro-mechanical devices. The control means may be powered from an external source via a power cord 284.

The control means sends the necessary operation signals in order to cause adhesive to process through the solenoid 24 and the delivery conduit 30 to the applicator 38. The applicator 38 is moved up toward and away from the appropriate lead frames in order to apply a pattern of adhesive to one surface, more particularly, the application surface 36 of each lead frame of a plurality of lead frames in a lead frame-by-lead frame sequence. Semiconductor devices such as device 78 are supplied by a source and transferred by attaching means which includes a transfer structure to a press mechanism. That is, the semiconductor devices, such as semiconductor device 79, are transferred to the press mechanism which in turn urges each semiconductor device in semiconductor device-by-semiconductor device sequence to and in contact with the patterned adhesive.

It should be noted that the preferred adhesive is a snap cure adhesive available from Quantum Materials, Inc. of San Diego, Calif. A preferred adhesive has been determined to be a snap cure epoxy which is known as the 505 epoxy formula. The desired snap cure epoxy is preferably defined to have a cure time of substantially less than one minute and preferably less than one second when it is applied with a block 110 that is preferably at a temperature between 200° and 225° C. That is, the block 110 is heated via conductor 160 to expedite the curing when the semiconductor devices are being attached to the attaching surface of each of the plurality of lead frames.

The snap cure epoxy and more particularly the 505 epoxy is preferred in metered amounts of about 1 milligram for every device site or for every device that is being applied to the lead frame. In some applications, multiple devices may be applied. In others, a single device may be applied.

In preferred arrangements, the epoxy applied preferably contains a nonconductive filer which may be made of Teflon®, Teflon® granular material or flakes of a particularly small semiconductor device may be mixed into the adhesive in order to function as a filler to achieve the desired tackiness and cure time.

The application means is preferably operated to apply the necessary amount of adhesive at each semiconductor device site. When a semiconductor device is pressed against the semiconductor device site, the adhesive is pressed to have a thickness of approximately 0.001 inch.

Other curable adhesives comparable to the 505 epoxy that are snap curable in one minute or less, and preferably one second or less, may be suitable.

Mechanisms for applying adhesive may include wiping mechanisms or other devices to clean away excess material to avoid contaminating different lead frames with excess adhesive material. Those skilled in the art will recognize that the embodiments are merely illustrative of the principles of the invention.

What is claimed is:

1. A semiconductor device assembly having a semiconductor device secured to a portion of a lead frame having a plurality of lead fingers, comprising:

a semiconductor device having an active surface having at least one bond pad thereon;

a lead frame having a portion thereof having an attaching surface for attaching the portion of the lead frame to a portion of the active surface of semiconductor device, the portion of the lead frame including a plurality of lead fingers adhesively secured solely by an adhesive to a portion of the active surface of the semiconductor device; and a quick curing adhesive attaching the portion of the lead frame to the portion of the active surface of the semiconductor device.

2. The semiconductor device assembly of claim 1, wherein the quick curing adhesive attaching the portion of the lead frame to the portion of the active surface of the semiconductor device has a curing time of substantially less than one minute.

3. The semiconductor device assembly of claim 1, wherein the quick curing adhesive attaching the portion of the lead frame to the portion of the active surface of the semiconductor device has a curing time of about one second.

4. The semiconductor device assembly of claim 1, wherein the quick curing adhesive attaching the portion of the lead frame to a portion of the active surface of the semiconductor device includes a snap curing adhesive.

5. The semiconductor device assembly of claim 1, wherein the portion of the lead frame includes a lead finger.

6. The semiconductor device assembly of claim 1, wherein the portion of the lead frame includes a bus bar.

7. A semiconductor device assembly having a semiconductor device and a lead frame including:

a semiconductor device having an active surface having a plurality of bond pads thereon;

a lead frame having at least one lead finger adhesively attached to a portion of the active surface of the semiconductor device solely by an adhesive; and a quick setting adhesive attaching a portion of the at least one of lead finger of the lead frame to a portion of the active surface of the semiconductor device.

8. The semiconductor device assembly of claim 7, wherein the quick setting adhesive includes an adhesive having a setting time of substantially one minute.

9. The semiconductor device assembly of claim 7, wherein the quick setting adhesive includes an adhesive having a setting time of about one second.

10. The semiconductor device assembly of claim 7, wherein the lead frame further includes:

at least one bus bar.

11. The semiconductor device assembly of claim 10, wherein the quick setting adhesive secures a portion of the bus bar to a portion of the active surface of the semiconductor device.

12. A leads-over-chip semiconductor device assembly having a semiconductor device and a lead frame comprising:

a semiconductor device having an active surface having at least one bond pad thereon;

a leads-over-chip type lead frame having at least one lead finger; and a quick setting adhesive attaching a portion of the at least one lead finger of the leads-over-chip lead frame to a portion of the active surface of the semiconductor device without any intervening carrier for the quick setting adhesive being located between the at least one lead finger and the active surface of the semiconductor device.

13. The leads-over-chip semiconductor device assembly of claim 12, wherein the quick setting adhesive includes an adhesive having a setting time of substantially one minute.

14. The leads-over-chip semiconductor device assembly of claim 12, wherein the quick setting adhesive includes an adhesive having a setting time of about one second.

* * * * *

UNITED STATES PATENT AND TRADEMARK OFFICE
CERTIFICATE OF CORRECTION

PATENT NO. : 6,016,004            Page 1 of 3
DATED : January 18, 2000
INVENTOR(S) : Schrock It is certified that error appears in the above-identified patent and that said Letters Patent is hereby corrected as shown below:

Title page,
Abstract,
Line 1, after "in" insert change "frame by frame" to -- lead frame-by-lead frame --;
Line 5, delete "and holds it during" and insert -- to each lead frame with the adhesive by holding the device -- therefor; and
Lines 6-7, delete "to each device site with adhesive".

Column 2,
Line 5, change "said" to -- semiconductor --;
Line 7, change "die" to -- device --;
Line 51, after "the" (first occurrence) insert -- application-and -- change "second" to -- opposing --;
Line 62, after "one" insert -- , --; after "and" change "preferable" to -- preferably --; after "two" insert -- , --;
Line 64, after "to" insert -- a --;

Column 3,
Line 10, after "and" insert -- attaching --;

Column 4,
Line 7, delete "18";
Line 8, after "adhesive" (first occurrence) insert -- 18 --; after "source" delete "18" and after "adhesive" (second occurrence) insert -- 18 --;
Line 21, after "source" insert -- of curable adhesive --;
Line 34, delete "one of";

Column 5,
Line 17, after "74" insert -- , --;

Column 6,
Line 44, after "plurality" insert -- of -- and change "device" to -- devices --;
Line 57, after "and" insert -- , --;
Line 58, after "particularly" insert -- , --;
Line 59, after "as" insert -- a --;
Line 60, after "and" insert -- , -- and after "specifically" insert -- , --;
Line 61, after "110" insert -- , --;

UNITED STATES PATENT AND TRADEMARK OFFICE
CERTIFICATE OF CORRECTION

PATENT NO. : 6,016,004
DATED : January 18, 2000
INVENTOR(S) : Schrock

It is certified that error appears in the above-identified patent and that said Letters Patent is hereby corrected as shown below:

Column 7,
Line 9, change "146" (both occurrences) to -- 135 --;
Line 33, after "turn" insert -- , --;
Line 38, change "An" to -- The --;
Line 54, change "34" to -- 36 --;
Line 59, change "34" to -- 36 --;

Column 8,
Line 2, after "delay" insert -- , -- and after "turn" insert -- , --;
Line 7, change "are" to -- is --;
Line 20, change "illustrate" to -- illustrated --;
Line 23, change "there-through" to -- therethrough --;
Line 27, after "The roller 200" insert -- is --;
Line 40, after "214" insert --, respectively --;
Line 50, change "with" to -- of --;

Column 9,
Line 1, change "external the" to -- the external --;
Line 11, change "are" to -- is --;
Line 26, change "there over" to -- thereover --;
Line 33, after "switch" (first occurrence) insert -- , --; after "280" insert -- , -- and change "on" (third occurrence) to -- "on" --;

Column 10,
Line 1, after "and" insert -- , -- and after "particularly" insert -- , --;
Line 7, change "filer" to -- filler --;
Line 8, change "," after Teflon® (first occurrence) to -- . --; and
Lines 8-9, delete "of a particularly small semiconductor device".

Claim 1, column 10,
Line 34, after "of" (second occurrence) insert -- the --;
Line 38, change "a" to -- the --;

UNITED STATES PATENT AND TRADEMARK OFFICE
CERTIFICATE OF CORRECTION

PATENT NO. : 6,016,004
DATED : January 18, 2000
INVENTOR(S) : Schrock

It is certified that error appears in the above-identified patent and that said Letters Patent is hereby corrected as shown below:

Claim 4, column 10,
Line 53, change "a" to -- the --;

Claim 7, column 10,
Line 67, delete "of" (first occurrence); and

Claim 11, column 11,
Line 12, before "bus" at beginning of line insert -- at least one --.

Signed and Sealed this

Thirtieth Day of October, 2001

*Attest:*

*Attesting Officer*

NICHOLAS P. GODICI
*Acting Director of the United States Patent and Trademark Office*